(12) United States Patent
Kurokawa et al.

(10) Patent No.: US 11,524,486 B2
(45) Date of Patent: Dec. 13, 2022

(54) SUBSTRATE FOR EPITAXTAIL, GROWTH AND METHOD FOR PRODUCING SAME

(71) Applicants: Toyo Kohan Co., Ltd., Tokyo (JP); Sumitomo Electric Industries, Ltd., Osaka (JP)

(72) Inventors: Teppei Kurokawa, Kudamatsu (JP); Yusuke Hashimoto, Kudamatsu (JP); Hironao Okayama, Kudamatsu (JP)

(73) Assignees: TOYO KOHAN CO., LTD., Tokyo (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 369 days.

(21) Appl. No.: 15/768,902

(22) PCT Filed: Oct. 21, 2016

(86) PCT No.: PCT/JP2016/081314
§ 371 (c)(1),
(2) Date: Apr. 17, 2018

(87) PCT Pub. No.: WO2017/069255
PCT Pub. Date: Apr. 27, 2017

(65) Prior Publication Data
US 2018/0297327 A1    Oct. 18, 2018

(30) Foreign Application Priority Data
Oct. 23, 2015    (JP) .............................. JP2015-209074

(51) Int. Cl.
*B32B 15/01*    (2006.01)
*B23K 20/02*    (2006.01)
(Continued)

(52) U.S. Cl.
CPC .......... *B32B 15/015* (2013.01); *B23K 20/023* (2013.01); *B32B 15/18* (2013.01);
(Continued)

(58) Field of Classification Search
CPC ....... B32B 15/015; B32B 15/18; B32B 15/20; C22F 1/08; B23K 20/023; C30B 1/02; C30B 25/18; C30B 29/02; H01L 39/2454
(Continued)

(56) References Cited

U.S. PATENT DOCUMENTS

2011/0290380 A1    12/2011    Okayama et al.
2012/0208703 A1    8/2012    Okayama et al.
2015/0299899 A1*   10/2015    Koshiro .................. H01L 39/24
                                                505/239

FOREIGN PATENT DOCUMENTS

CN    102210009    10/2011
CN    102473486    5/2012
(Continued)

OTHER PUBLICATIONS

International Search Report based on PCT International Application No. PCT/JP2016/081314, dated Dec. 6, 2016—2 Pages.
(Continued)

*Primary Examiner* — Brian D Walck
*Assistant Examiner* — Danielle Carda
(74) *Attorney, Agent, or Firm* — McCarter & English, LLP

(57) ABSTRACT

It is an object to provide a method for producing a substrate for epitaxial growth having a higher degree of biaxial crystal orientation without forming an irregular part a3. The method for producing a substrate for epitaxial growth comprising a step of laminating a metal base material and a copper layer having an fcc rolling texture by surface-activated bonding, a step of applying mechanical polishing to the copper layer, and a step of carrying out orientation heat treatment of the copper layer, wherein the copper layer is laminated in such a way that, when ratios of the (200) plane of the copper layer before laminated and of the copper layer after laminated when measured by XRD are $IO_{Cu}$ and $IO_{CLAD}$, respectively
(Continued)

and ratios of the (220) plane of the copper layer before laminated and of the copper layer after laminated are $I2_{Cu}$ and $I2_{CLAD}$, respectively, $I0_{Cu}<20\%$, $I2_{Cu}=70$ to $90\%$, and $I0_{CLAD}<20\%$, $I2_{CLAD}=70$ to $90\%$ and $I0_{CLAD}-I0_{Cu}<13\%$.

3 Claims, 8 Drawing Sheets

(51) Int. Cl.

| | |
|---|---|
| *B32B 15/18* | (2006.01) |
| *B32B 15/20* | (2006.01) |
| *C22F 1/08* | (2006.01) |
| *C30B 25/18* | (2006.01) |
| *C30B 29/02* | (2006.01) |
| *C30B 1/02* | (2006.01) |
| *H01L 39/24* | (2006.01) |

(52) U.S. Cl.
CPC ............... *B32B 15/20* (2013.01); *C22F 1/08* (2013.01); *C30B 1/02* (2013.01); *C30B 25/18* (2013.01); *C30B 29/02* (2013.01); *H01L 39/2454* (2013.01)

(58) Field of Classification Search
USPC .......................................................... 148/536
See application file for complete search history.

(56) References Cited

FOREIGN PATENT DOCUMENTS

| | | |
|---|---|---|
| JP | 5723773 | 4/2015 |
| WO | 2010/055612 | 5/2010 |
| WO | 2011/007527 | 1/2011 |
| WO | 2014/054351 | 4/2014 |
| WO | WO-2016068046 A1 * | 5/2016 ............. B32B 15/01 |

OTHER PUBLICATIONS

Chinese Office Action based on co-pending Chinese Patent Application No. 201680060793.3, dated Nov. 6, 2019—5 Pages.

* cited by examiner (a)

(b)

(a)

(b)

SUBSTRATE FOR EPITAXTAIL, GROWTH AND METHOD FOR PRODUCING SAME

CROSS-REFERENCE TO RELATED APPLICATIONS

This application is a national stage application filed under 35 USC 371 of PCT/JP2016/081314, filed Oct. 21, 2016, which claims the benefit of Japanese Patent Application No. 2015-209074, filed Oct. 23, 2015, each of which is incorporated herein, in its entirety, by reference.

TECHNICAL FIELD

The present invention relates to a substrate for epitaxial growth and a method for producing the same.

BACKGROUND ART

A superconducting wire is produced by laminating intermediate layers consisting of a single layer or a plurality of layers comprising oxide layers such as cerium oxides ($CeO_2$), yttria-stabilized zirconia (YSZ) or yttrium oxide ($Y_2O_3$) and a buffer layer on a metal substrate and further laminating a superconducting layer (RE123 films, RE: Y, Gd, Ho, Sm and Dy and the like) thereon.

As a technique for obtaining a crystal-oriented superconducting layer, a film forming method is known wherein a biaxially crystal-oriented metal substrate prepared using a rolled/recrystallized structure is used to cause the intermediate layer and the superconducting layer to have the same crystal orientation (RABiTS method). For improving characteristic values of a Y-based superconducting wire, the metal substrate needs to have a high degree of biaxial crystal orientation, and superconducting characteristic is adversely affected when those other than a specific crystal orientation are present.

The method described in (Patent Literature 1) is known as a method for producing a metal substrate wherein the outer metal layer is highly oriented (a substrate for epitaxial growth). (Patent Literature 1) discloses a method for producing a metal laminated substrate for oxide superconducting wire comprising a step of sputter etching the surface of a copper foil rolling-processed at a rolling reduction ratio of 90% or more while maintaining the foil at a temperature lower than the crystal orientation temperature to remove a surface adsorbate thereon, a step of sputter etching the surface of a non-magnetic metal plate to remove a surface adsorbate thereon, a step of bonding the copper foil and the metal plate by using rolling rolls with a pressure of 300 MPa to 1500 MPa, a step of crystal-orienting the copper by heating the bonded laminate at a temperature higher than the crystal orientation temperature of copper, and a step of coating the copper-side surface of the laminate with a protective layer. In this production method, when the copper layer (copper foil) has been recrystallized at the stage of being bonded, it is understood that the crystal orientation of the entire copper layer does not proceed by the subsequent orientation heat treatment and the c-axis orientation ratio (ratio of the (200) plane) when measured by XRD significantly decreases to 90% or less.

Separately, in a substrate for epitaxial growth, it is understood that a surface roughness is desirably controlled to maintain good crystal orientation of the intermediate layer and the superconducting layer to be laminated thereon. (Patent Literature 2) discloses that, after the non-magnetic metal plate and the copper layer are bonded, a treatment may be carried out for reducing a surface roughness Ra of the copper layer and discloses, as specific means, methods such as rolling under pressure, buffing, electropolishing and electro-abrasive polishing.

CITATION LIST

Patent Literature

Patent Literature 1: JP Patent No. 5723773
Patent Literature 2: International Publication No. WO2014/054351 (Paragraph 0036)

SUMMARY OF INVENTION

Technical Problem

The present inventors conducted research and development and revealed that, in a substrate for epitaxial growth in which the copper layer bonding and orientation heat treatment were carried out according to the prior art, an orientation irregular part (hereinafter referred to as "irregular part") which did not orient to the (200) plane appeared in the outermost layer despite a c-axis orientation ratio being 99% or more when measured by XRD. The present inventors investigated a cause and found that the irregular part was only present in the shallow part from the surface of the copper layer and caused to appear when processed in the step of the mechanical polishing. This new finding will be specifically described. Note that the "mechanical polishing" herein refers to physical polishing or chemical mechanical polishing which polishes the surface by a physical force using an abrasive, a polishing stone or an abrasive cloth, with examples including dry polishing such as roll polishing, grinder polishing, hand polishing and buffing, and wet mechanical polishing.

For highly crystal-orienting the bonded copper layer, two processes are required, which are that the copper layer before the orientation heat treatment has an fcc rolling texture (i.e., (220) plane orientation) and simultaneously a major work strain is introduced, and the copper layer is oriented to the (200) plane by heat treatment for recrystallization. In the copper crystal grains recrystallized at the (200) plane when once heated, the work strain introduced by the rolling disappears.

In the prior art, when a part not orienting to the (200) plane was present in the heat-treated copper layer, the c-axis orientation ratio when measured by XRD decreased as described in (Patent Literature 1). However, as for the irregular part found by the present inventors, the copper layer had a c-axis orientation ratio of 99% when measured by XRD despite an area ratio of the irregular part on the surface of the copper layer being more than 2%. Note that the normal (200) plane has crystal grains having grain diameters of about 30 μm to 200 μm but this irregular part is an aggregate of grains having small grain diameters, thus revealing that the grains do not orient to the (200) plane, that is, the orientation is irregular. The irregular part, as shown in FIG. 1, appears in the shallow part from the surface of the copper layer (within 3 μm from the surface of the copper layer) (FIG. 1(b)) and the copper present underneath the irregular part was normally oriented to the (200) plane.

Additionally, as for the laminated materials in which the copper layer and the metal substrate were bonded under the same condition, a sample A which was heat treated without applying the mechanical polishing after bonded and a sample B which was heat treated after mechanically polished after bonded were compared and found that the irregular part was not found in the sample A but only in the sample B. In other words, it is revealed that the irregular part does not appear in the case of undergoing only the bonding step but the subsequent mechanical polishing causes the irregular part to appear. The present inventors presumed as follows based on these results. More specifically, as shown in FIG. 2, a partially recrystallized region a1 is first formed when a metal base material 10 and a copper layer 20 are bonded (FIG. 2(a)) and subsequently a work strain a2 is introduced only into the outermost layer of the recrystallized region a1 by the mechanical polishing using a flap wheel 30 (FIG. 2(b)). The work strain a2 introduced by the mechanical polishing is a cutting strain, which develops differently from a strain introduced by the rolling at a high reduction at the time of producing the copper layer and is not as major as the work strain introduced by the rolling at a high reduction, thus not orienting to the (200) plane by the subsequent heat treatment and eventually settling as an irregular part a3 (FIG. 2(c)).

Incidentally, the (200) plane is also included in the copper layer before laminated but is in the state in which major work strains have already been introduced into the (200) plane thereof by the rolling at a high reduction as in the surrounding (220) plane and thus not being affected by the work strain to be introduced by the subsequent mechanical polishing. Consequently, the achievement of a high degree of the (200) plane crystal orientation at the time of heat treatment is not interfered.

Thus, the present invention, in the light of the above newly obtained finding, has an object to provide a substrate for epitaxial growth having a higher degree of biaxial crystal orientation without forming an irregular part a3 and a method for producing the same.

Solution to Problem

The present inventors conducted extensive studies to solve the above problems and found that the appearance of the irregular part after the heat treatment can be inhibited where, when the ratio of the (200) plane at the copper layer before laminated is $I0_{cu}$, a copper layer of $I0_{cu}<20\%$ is used, and an increase ratio in the (200) plane ratio before and after lamination is less than 13% and a (200) plane ratio of the copper layer after laminated $I0_{clad}$ is less than 20%, whereby the present invention was accomplished. More specifically, the gist of the present invention is as follows.

Note that, in the present Description, the substrate for epitaxial growth refers to those wherein a biaxially crystal-oriented copper layer is, or the copper layer and a protective layer are, laminated on a metal base material. Thus, the substrate for epitaxial growth refers to a concept which encompasses substrates for forming a film of solar power generation layer such as Si and semiconductor substrates for forming a film of semiconductor layer, in addition to the substrate for superconducting wire used to produce a superconducting wire by forming an intermediate layer and a superconducting layer thereon.

(1) A method for producing a substrate for epitaxial growth comprising a step of laminating a metal base material and a copper layer having an fcc rolling texture by surface-activated bonding, a step of applying mechanical polishing to the copper layer, and a step of carrying out orientation heat treatment of the copper layer, wherein the copper layer is laminated in such a way that, when ratios of a (200) plane of the copper layer before laminated and of the copper layer after laminated when measured by XRD are $I0_{Cu}$ and $I0_{CLAD}$, respectively and ratios of a (220) plane of the copper layer before laminated and of the copper layer after laminated are $I2_{Cu}$ and $I2_{CLAD}$, respectively, $I0_{Cu}<20\%$, $I2_{Cu}=70$ to 90%, and $I0_{CLAD}<20\%$, $I2_{CLAD}=70$ to 90% and $I0_{CLAD}-I0_{Cu}<13\%$.

(2) The method for producing a substrate for epitaxial growth according to the above (1), wherein, on the surface of the copper layer after carrying out the orientation heat treatment, an area occupied by crystal grains having crystal orientations other than the (200) plane present within 3 μm from the surface is less than 1.5%.

(3) The method for producing a substrate for epitaxial growth according to the above (1) or (2), wherein a depth of cut in a thickness direction by the mechanical polishing is 2 μm to 5 μm.

(4) The method for producing a substrate for epitaxial growth according to any one of the above (1) to (3), wherein the step of applying mechanical polishing includes buffing.

(5) The method for producing a substrate for epitaxial growth according to any one of the above (1) to (4), wherein the step of laminating by surface-activated bonding is carried out by bonding the metal base material and the copper layer using a rolling roll, and the step of applying mechanical polishing is carried out by applying polishing by roll-buffing in the same direction as the rolling direction and subsequently applying light-rolling at a rolling reduction ratio of 0 to 1% using a mirror surface roll wherein, at the copper layer after applying mechanical polishing, a surface roughness along the same direction as the rolling direction per unit length of 60 μm when measured by AFM is Ra1<10 nm and a surface roughness along the perpendicular direction to the rolling direction is Ra2<30 nm.

Note that the "applying polishing in the same direction as the rolling direction" herein means that the feed direction of the laminated material consisting of the metal base material and the copper layer is set to be the same direction as the rolling direction when polishing. The rotation direction of the roll used for polishing may be the forward direction to the feed direction of the laminated material or may be the backward direction to increase a depth of cut.

(6) A substrate for epitaxial growth, wherein a metal base material and a copper layer are laminated and, on the surface of the copper layer, an area occupied by crystal grains having crystal orientations other than the (200) plane present within 3 μm from the surface is less than 1.5%.

(7) A substrate for epitaxial growth, wherein a metal base material and a copper layer are laminated, a protective layer comprising nickel or a nickel alloy is further laminated onto the copper layer, and, on the surface of the protective layer, a ratio occupied by crystal grains having crystal orientations other than a (200) plane is less than 2.0%.

The present Description encompasses the contents disclosed in Japanese Patent Application No. 2015-209074, which is the basis of the priority of the present application.

Advantageous Effects of the Invention

According to the present invention, a substrate for epitaxial growth is obtained wherein the appearance of an irregular part after heat treatment is inhibited and a copper layer or a protective layer such as nickel disposed on the copper layer is biaxially crystal-oriented in a high degree. Using such a substrate for epitaxial growth enables the production of a superconducting wire having good properties.

DESCRIPTION OF EMBODIMENTS

Figure 1:
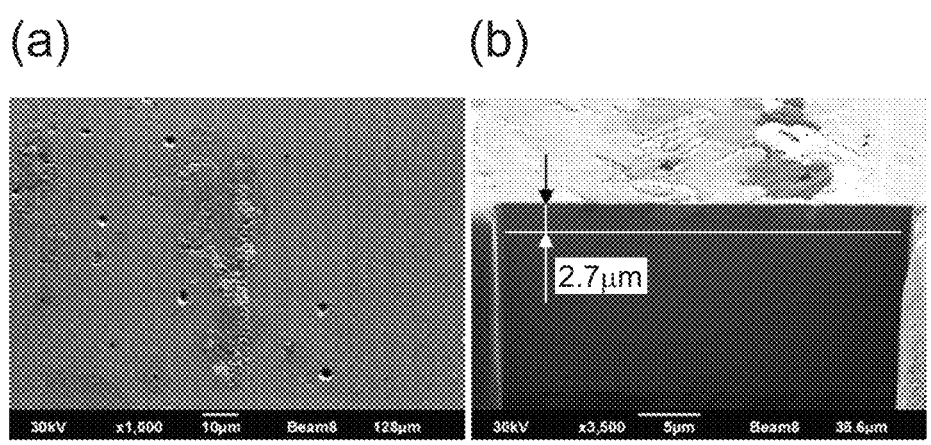
FIG. 1 (a) is a scanning ion microscope (SIM) image by focused ion beam (FIB) of an irregular part in a substrate for epitaxial growth prepared by the prior art, and (b) is an SIM image of a cross section of the irregular part by FIB.
Figure 2:
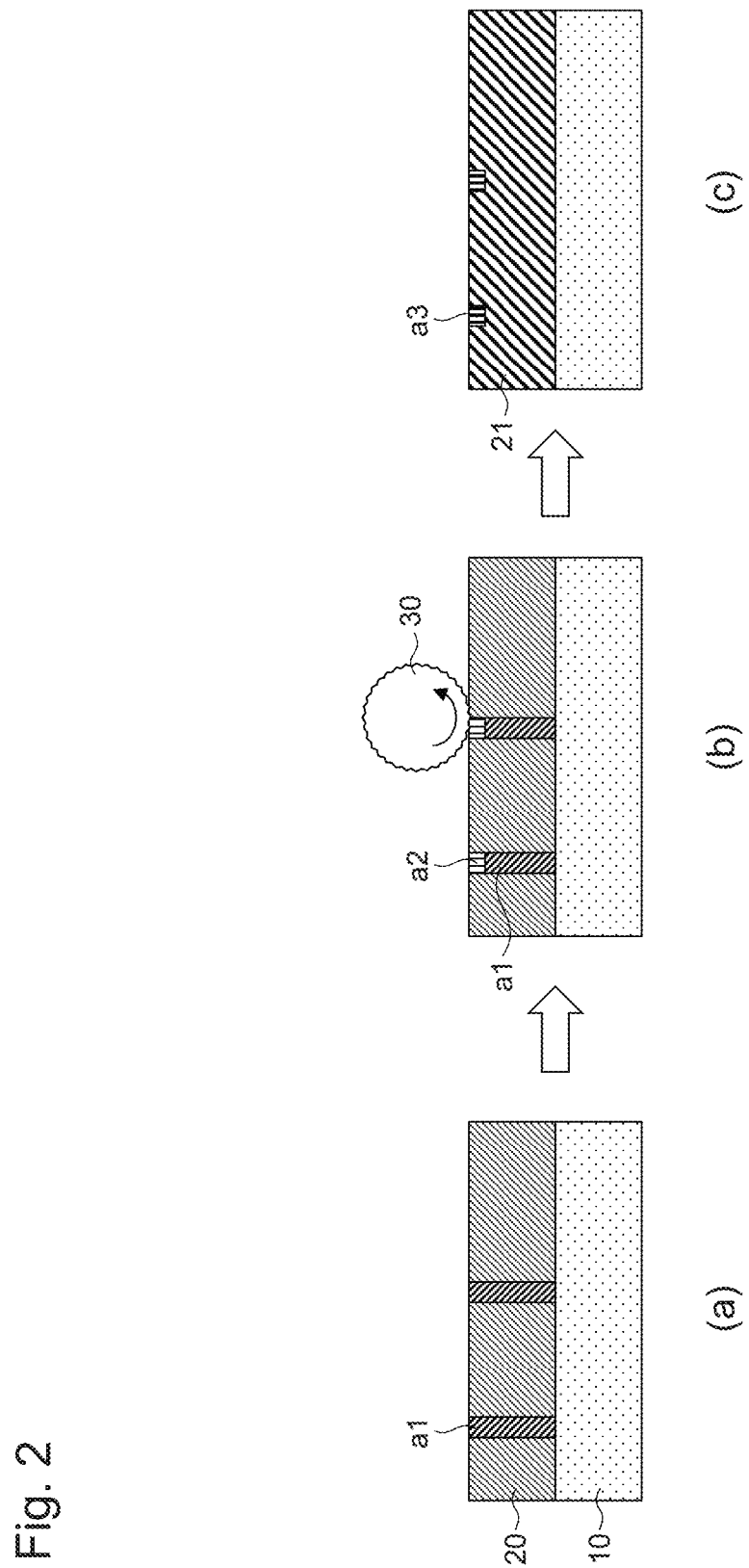
FIG. 2 is a schematic drawing to illustrate the formation process of the irregular part.

Hereinafter, the present invention is described in detail.

The method for producing a substrate for epitaxial growth of the present invention comprises a step of laminating a metal base material and a copper layer having an fcc rolling texture by surface-activated bonding, a step of applying mechanical polishing to the copper layer, and a step of carrying out orientation heat treatment of the copper layer.

For the metal base material, a non-magnetic metal plate is used in the case of superconducting wire. Note that the copper layer may be laminated on one side of a non-magnetic metal plate or on both sides of a non-magnetic metal. In the present invention, the "non-magnetic" refers to the state which is not ferromagnetic at 77K or more, that is, curie temperature and Neel temperature are at 77K or less, but is paramagnetic or diamagnetic at a temperature of 77K or more. For the non-magnetic metal plate, nickel alloy and austenitic stainless steel plates are preferably used for serving as a role of reinforcing material with good strength.

Austenite stainless steels are generally in the non-magnetic state at room temperature, more specifically, the metal structure is 100% austenite (γ) phase, but when ferromagnetic martensitic (α') phase transformation point (Ms point) is located at 77K or more, the ferromagnetic c phase may appear at a liquid nitrogen temperature. For this reason, a metal base material designed to have an Ms point of 77K or less is preferably used to be the metal base material for a substrate for epitaxial growth to be used at a liquid nitrogen temperature (77K).

For the γ stainless steel plate to be used, plate materials such as SUS316 and SUS316L, SUS310 and SUS305 are preferably used from the viewpoint of having a stable γ phase designed to have the Ms point sufficiently less than 77K and being commonly distributed and available at a comparatively low price. These metal plates are typically applicable with a thickness of 20 µm or more, and a thickness of 50 µm or more and 100 µm or less is preferable when considering the thinning and strength of a superconducting wire but not limited to this range.

The copper layer to be laminated with the metal base material has an fcc rolling texture, is cold-rolled preferably at a rolling reduction ratio of 90% or more, further preferably at a rolling reduction ratio of 95% or more and less than 99%, after the final rolling, and retains a rolling texture developed by the cold-rolling without heat treatment for recrystallization after the cold-rolling. When a rolling reduction ratio is less than 90%, the copper may not be oriented by the orientation heat treatment to be carried out later.

The copper layer may contain about 1% or less of elements to improve the biaxial crystal orientation by the subsequent heat treatment. Examples of the element to be added include one or more elements selected from Ag, Sn, Zn, Zr, O and N. These elements to be added and copper form a solid solution but when an amount added exceeds 1%, impurities such as oxides other than the solid solution increase, likely adversely affecting the crystal orientation.

For such a copper layer, a copper foil is preferably used. Copper foils are commonly available and examples include a high reduction rolled copper foil (HA foil) manufactured by JX Nippon Mining & Metals Corporation and a high reduction rolled copper foil (HX foil) manufactured by SH Copper Products Co., Ltd.

The thickness of the copper layer typically ranges from 7 µm to 70 µm, preferably from 15 µm to 70 µm, for ensuring the strength of the copper layer itself and good workability of a superconducting wire for the subsequent work.

Figure 3:
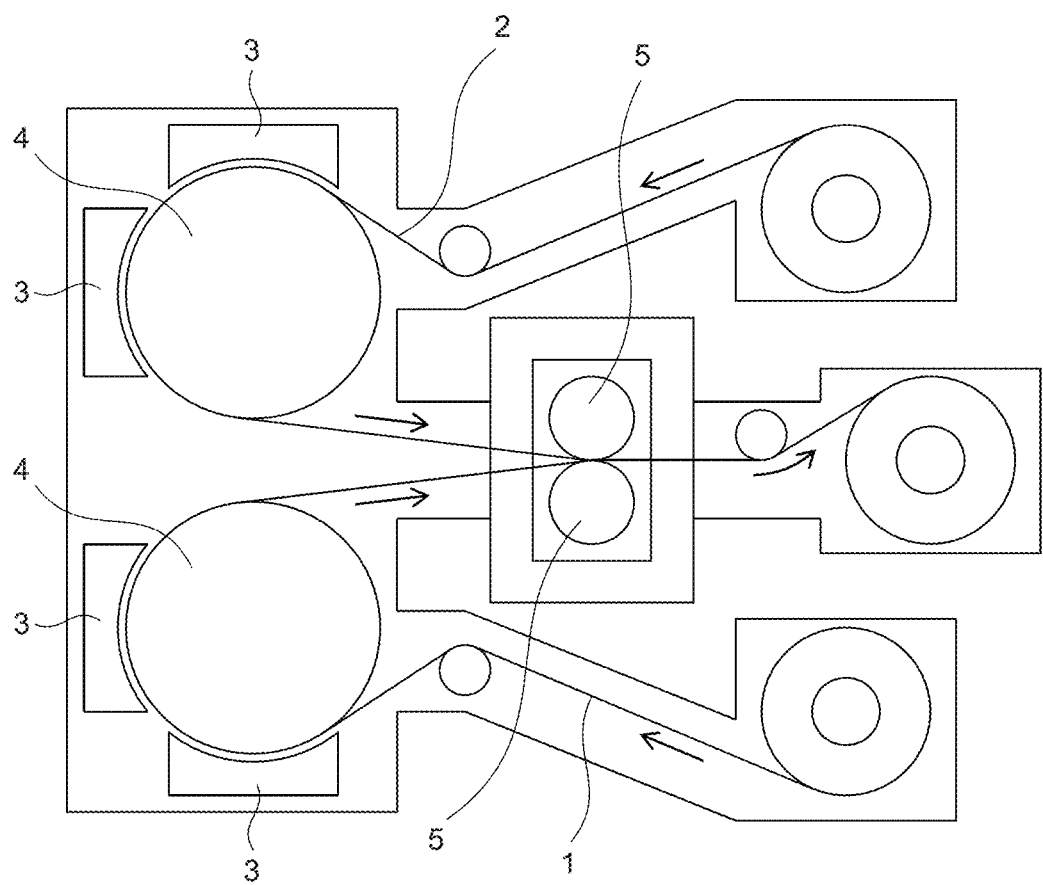
FIG. 3 is a drawing to illustrate the step of laminating a metal base material and a copper layer by surface-activated bonding.

In the step of laminating the metal base material and the copper layer having an fcc rolling texture by surface-activated bonding, a metal base material 1 and a copper layer 2 are prepared in the form of long coils having a width of, for example, 150 mm to 600 mm as shown in FIG. 3, sputter etching treatment is applied to the surfaces of each of the metal base material 1 and the copper layer 2 using a sputter etching system 3 to remove a surface adsorbate layer and a surface oxide film and activate the two surfaces to be bonded, followed by cold bonding the activated surfaces with each other, whereby the metal base material 1 and the copper layer 2 retaining the rolling texture are bonded.

The surface activation treatment is carried out by using the metal base material 1 and the copper layer 2 having bonding surfaces each as one of the electrodes which are connected to ground, applying AC voltage between other insulated and supported electrodes and the electrodes which are connected to ground to generate glow discharge, and exposing the surfaces of the metal base material 1 and the copper layer 2 in the plasma produced by the glow discharge for the sputter etching treatment. Examples of the applicable inert gas include argon, neon, xenon and krypton, and a mixed gas containing at least one of these gases. During the sputter etching treatment, the electrodes which are connected to ground take the form of cooling rolls 4 and prevent the temperature of each delivered material from increasing.

In the present invention, the conditions for the surface activation treatment are suitably adjusted for inhibiting the recrystallization of the copper layer 2 before laminated. More specifically, the etching time and output during the surface activation treatment are adjusted in such a way that, when ratios of the (200) plane of the copper layer before laminated and of the copper layer after laminated when measured by XRD are $I0_{Cu}$ and $I0_{CLAD}$, respectively and ratios of the (220) plane of the copper layer before laminated and of the copper layer after laminated are $I2_{Cu}$ and $I2_{CLAD}$, respectively, $I0_{Cu}<20\%$, $I2_{Cu}=70$ to 90%, and $I0_{CLAD}<20\%$, $I2_{CLAD}=70$ to 90% and $I0_{CLAD}-I0_{Cu}<13\%$. When the value of $I0_{CLAD}-I0_{Cu}$ is preferably 6% or less, particularly 5% or less, the appearance of the irregular part can be inhibited more effectively. The specific conditions at the time of adjusting the etching time and output are not limited and vary depending on the tension applied to the copper layer and the compatibility with other conditions, but the total etching time is 15 seconds to 60 seconds and the output at the time of generating glow discharge is, for example, 50 W to 150 W each when disposing two generators, and it is preferable to suitably determine from a range of preferably 70 W to 130 W.

Additionally, minute texture unevenness at the copper layer 2 may cause a phenomenon where the copper layer 2 partially slightly detaches from the cooling roll 4. This phenomenon is likely to occur when a thickness of the copper layer is as thin as 70 μm or less, particularly when a thickness of the copper layer is 17 μm or less. When such a phenomenon occurs, the part of the copper layer 2 detached from the cooling roll 4 is heated without being cooled and the region is recrystallized, hence not preferable. Thus, it is preferable to allow the copper layer 2 and the cooling rolls 4 to be in even contact by controlling the tension of the copper layer 2 to be delivered in such a way that $I0_{Cu}$<20%, $I2_{Cu}$=70 to 90%, and $I0_{CLAD}$<20%, $I2_{CLAD}$=70 to 90% and $I0_{CLAD}$–$I0_{Cu}$<13%. As described above, $I0_{CLAD}$–$I0_{Cu}$ is preferably 6% or less, more preferably 5% or less. The specific condition on the tension varies depending on conditions such as the above etching time and output, but it is preferably to deliver the copper layer 2 in a tension of, for example, 30 N/mm$^2$ to 70 N/mm$^2$.

Note that, during the above sputter etching treatment, the adsorbate on the bonding surfaces is thoroughly removed but the surface oxide layer does not need to be thoroughly removed. This is because even when the oxide layer remains throughout the entire surface, the bonding of the metal base material and the copper layer can be ensured by exposing the untreated bases due to the friction at the bonding surfaces in the process of cold bonding.

When the oxide layer is attempted to be thoroughly removed by the sputter etching treatment, a high plasma output or prolonged etching time is required, thereby possibly increasing the temperature of materials. In the sputter etching treatment, when the temperature of the copper layer increases more than the recrystallization initiation temperature of copper, recrystallization of copper occurs and consequently the copper layer is crystal-oriented before bonding. When the crystal-oriented copper layer is rolled, strains are introduced into the copper layer thereby deteriorating the biaxial crystal orientation of the copper layer. For this reason, the temperature of the copper layer 2 must be retained less than the recrystallization initiation temperature of copper in the sputter etching treatment. Specifically, the temperature of the copper layer is retained less than 150° C. Preferably, the temperature is retained 100° C. or less to retain the metal structure of the copper layer as the rolling texture.

Similarly, in the sputter etching treatment of the metal base material 1, it is desirable to keep the temperature of the metal base material 1 less than the recrystallization initiation temperature of the copper layer 2. Specifically, the condition for the sputter etching treatment of the metal base material 1 is controlled so that the temperature of the copper layer 2 is less than 150° C. It is preferable to control the temperature of the metal base material 1 so that the temperature of the copper layer 2 is kept at room temperature to 100° C.

After activating the surfaces of the metal base material 1 and the copper layer 2 as described above, both are bonded in vacuum using rolling rolls 5 as shown in FIG. 3. The degree of vacuum at this time is preferably higher to block the re-adsorbed material to the surface but may be in a range from $10^{-5}$ Pa to $10^{-2}$ Pa. Additionally, as the re-adsorption of oxygen to the surfaces of the metal base material 1 and the copper layer 2 reduces the adhesion strength between the two, it is also preferable to carry out the bonding using the rolling rolls 5 in a non-oxidizing atmosphere, for example, in an inert gas atmosphere like Ar.

Pressure application by the rolling rolls 5 is carried out to ensure the adhesion area of the bonded interface and to partially peel the surface oxide layer by the friction generated at the bonded interface when reduced and expose the base. It is thus preferable to apply 300 MPa or more, particularly preferably 600 MPa to 1.5 GPa as both the metal base material 1 and the copper layer 2 are hard materials. Pressure may be applied even more and is preferably applied in such a way that a rolling reduction ratio is less than 5%, although the crystal orientation is confirmed not to be deteriorated after the subsequent heat treatment up to a rolling reduction ratio of 30%. When a pressure exceeding a rolling reduction ratio of 30% is applied, cracks are caused on the surface of the copper layer 2, also deteriorating the crystal orientation of the copper layer 2 after rolling and heat treatment, hence not preferable.

After laminating the metal base material and the copper layer by the surface-activated bonding, mechanical polishing is applied to the copper layer to reduce the surface roughness thereof to maintain good crystal orientation of the protective layer to be laminated thereon or of the intermediate and superconducting compound layer to be laminated thereon by epitaxial growth. Mechanical polishing is good in productivity and can obtain satisfactory surface roughness.

When a laminated material consisting of the metal base material and the copper layer is produced by roll-to-roll as shown in FIG. 3, the longer direction of the laminated material is the same direction as the rolling direction. In the rolling of the copper layer, crack defects perpendicular to the rolling direction are likely to occur by the rolling, and it is preferable that a depth of cut in the thickness direction by the mechanical polishing be 2 μm or more to remove such a crack defect. Additionally, in the superconducting wire, when the surface roughness particularly in the longer direction is high, a superconducting flow is interfered and superconducting properties are notably reduced. Thus, surface roughness Ra1 along the longer direction (same direction as the rolling direction) is preferentially lowered. For planarizing Ra1, it is preferable that a depth of cut in the thickness direction be 5 μm or less.

For lowering the surface roughness Ra1 in the rolling direction, it is particularly effective to carry out buffing as the mechanical polishing. The kind of abrasive grain used for buffing can be suitably selected, but particularly when buffing using SiC abrasive grains followed by buffing using $Al_2O_3$ abrasive grains is carried out, Ra1 per unit length of 60 μm when measured by AFM can be made as low as less than 10 nm. The buffing step may be carried out more than once such as performed in multistages.

When only the above buffing is carried out, surface roughness Ra2 along perpendicular direction to the rolling direction is not only less likely lowered but polishing traces called buffing marks are left, making Ra2 rather higher. The increase in Ra2 is likely to reduce superconducting properties, though not as much as Ra1. Additionally, even with Ra1 being low, when Ra2 is high or Rzjis is high, crystals of Ni, in the case of using an electrolytic Ni plating when forming the protective layer, are preferentially deposited from the convex parts of the copper layer, thereby likely deteriorating the surface roughness. As discussed herein, Rzjis refers to a 10-point average roughness. The 10-point average roughness can be determined by a section of standard length sampled from the roughness curve in the mean line direction, and the sampled section of the mean line is measured in the longitudinal magnification direction. The sum of an average value of the absolute values of the 5 tallest peaks (Yp) and an average value of the absolute values of the 5 lowest valleys (Yv) is determined and expressed in micrometer (μm) to represent Rzjis. Accordingly, it is preferable to apply polishing by roll-buffing in the same direction as the rolling direction and subsequently apply light-rolling at a rolling reduction ratio of 0 to 1% using a mirror surface roll. It is revealed that Ra2 and Rzjis can be sufficiently lowered when the light-rolling is applied. Particularly, when the light-rolling is repeated twice or more, Ra2 per unit length of 60 μm can be less than 15 nm and Rzjis per unit area of 60×60 μm$^2$ can be less than 200 nm. At this time, a surface roughness Ra per unit area of 60×60 μm$^2$ is less than 20 nm, preferably less than 15 nm. Note that all the surface roughnesses of the present invention refer to the values measured according to JIS B0601:2001.

For maintaining good crystal orientation, surface roughnesses Ra1 and Ra2 per unit length of 60 μm and a value of Rzjis per unit area of 60×60 μm$^2$ obtained by using a cross section function of the AFM system at the copper layer after the mechanical polishing is applied are preferably Ra1<10 nm, Ra2<30 nm and Rzjis<220 nm, more preferably Ra1<7 nm, Ra2<20 nm and Rzjis<200 nm, further preferably Ra1<6 nm, Ra2<13 nm and Rzjis<170 nm.

As long as the surface roughness of the copper layer can be reduced, other polishing methods can be used as necessary in addition to buffing, or buffing and the light-rolling using a mirror surface roll, and examples include electropolishing and electro-abrasive polishing. Electropolishing may be carried out after the step of orientation heat treatment as a work strain is not introduced thereinto.

Next, to the mechanically polished laminated material of the metal base material and the copper layer, the orientation heat treatment of the copper layer is carried out thereby obtaining a substrate for epitaxial growth in which the copper layer is crystal-oriented. The orientation heat treatment is carried out, for example, at a temperature of 150° C. or more. The heat treatment time varies depending on the temperature, and, for example, may be 1 hour to 10 hours at 400°, and several seconds to about 5 minutes at a high temperature of 700° C. or more. With a too high heat treatment temperature, the copper layer is likely to cause secondary recrystallization deteriorating the crystal orientation, and thus the heat treatment is carried out at 150° C. or more and 1000° C. or less. When considering that the substrate is placed in a high temperature atmosphere at 600° C. to 900° C. during the subsequent step of forming the intermediate layer and the superconducting layer, it is preferable to carry out the heat treatment at 600° C. to 900° C. Further preferably, the crystal orientation of the copper layer and the protective layer to be subsequently formed can be enhanced by carrying out, in a stepwise manner, a low-temperature heat treatment (first heat treatment) followed by a high-temperature heat treatment (second heat treatment). Specifically, it is preferable that, after the heat treatment at 200° C. to 400° C., the heat treatment be carried out at 800° C. to 900° C. It is more preferable that, after the heat treatment at 250° C. to 325° C., the heat treatment be carried out at 850° C. to 900° C. The heat treatment time at the first heat treatment can be about 5 minutes to 240 minutes. Further, the heat treatment time at the second heat treatment is, though varies depending on other conditions, preferably comparatively short time, specifically a soaking time is preferably less than 10 minutes, particularly preferably 1 minute to 5 minutes. The soaking time used herein refers to the time during which the copper layer is held inside a furnace in which a temperature has reached a predetermined temperature. When a soaking time is set to be 10 minutes or more, the surface roughness of the copper layer may be slightly deteriorated or the secondary recrystallization and excessive reorientation may be caused, consequently leading to the possible deterioration of the surface roughness of the protective layer disposed on the copper layer.

Figure 4:
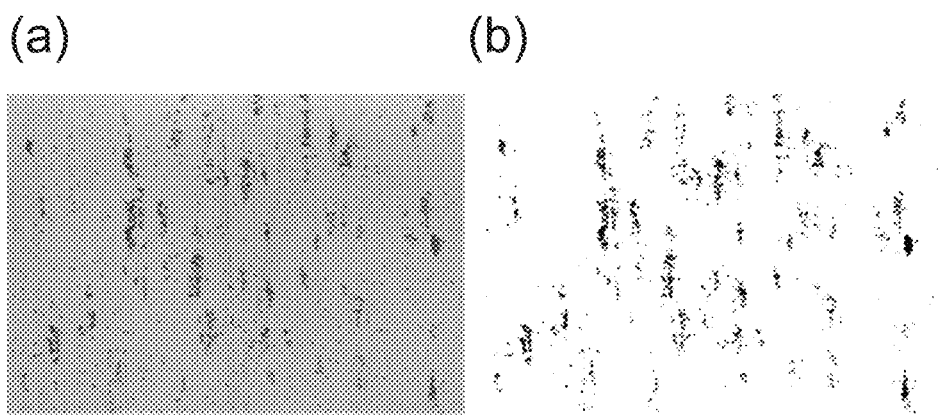
FIG. 4 is an optical microscope image of the copper layer surface including crystal grains having crystal orientations other than the (200) plane.

In the substrate for epitaxial growth thus obtained, an area occupied by crystal grains having crystal orientations other than the (200) plane present within 3 μm from the surface of the copper layer can be less than 1.5%, thereby enabling to obtain a higher degree of crystal orientation. The crystal grains having crystal orientations other than the (200) plane herein have an individual crystal grain size of several μm as seen in the SIM image which are apparently smaller than the crystal grains having the (200) plane crystal orientation, but, as shown in FIG. 4, fine crystal grains having several μm form an aggregate (width: 20 μm to 50 μm, length: 50 to 150 μm) and thus are distinguishable by the optical microscopic observation. The area occupied by crystal grains having crystal orientations other than the (200) plane is defined as the average value of area ratios, which are obtained by optical-microscopically observing optionally selected 10 fields (each field is 1.5 mm$^2$) and calculating each of the fields. When calculating the area ratio, the optical microscope image shown in FIG. 4(*a*) is binarized as shown in (*b*).

Further, a protective layer comprising nickel or a nickel alloy can be formed by plating on the biaxially crystal-oriented copper layer. The protective layer has the same crystal orientation as the copper layer, whereby a substrate for epitaxial growth is obtained in which the metal base material and the copper layer are laminated and further the protective layer comprising nickel or a nickel alloy is laminated onto the copper layer on the surface of which a ratio occupied by crystal grains having crystal orientations other than the (200) plane is less than 2.0%. The nickel-comprising protective layer has more excellent oxidation resistance than the copper layer, and further the presence of the protective layer produces an oxide film of copper when forming the intermediate layer such as CeO$_2$ thereon and can prevent the crystal orientation from being disordered. The element comprised in the nickel alloy is preferable to reduce magnetic properties, and the examples include elements such as Cu, Sn, W and Cr. Additionally, the alloy may contain impurities as long as the crystal orientation is not adversely affected. Note that, after forming the protective layer comprising nickel or a nickel alloy by plating, minute recesses are notable on the surface. On the contrary, the irregular part which does not orient to the (200) plane is an aggregate of small crystal grains and thus is distinguishable by the optical microscopic observation from the above recesses. However, when an optical microscope image is binarized, the recesses appeared as black dots are also added as the black parts as in the irregular part, thereby increasing an apparent area ratio of the irregular part to be calculated. In fact, in those where a nickel or a nickel alloy is laminated on a copper layer with no irregular part, an area ratio of the black parts is 0.5 to 1% when binarized, and also in the case where a nickel or a nickel alloy is laminated on a copper layer on which irregular parts appeared, a calculated area ratio of the irregular parts increases more than the measured value at the copper layer before plating. However, the area ratio of the irregular part itself is confirmed not to remarkably increase due to the formation of the protective layer and thus, in the present invention, it can be decided that a high degree of the crystal orientation is obtained as long as the ratio occupied by crystal grains having crystal orientations other than the (200) plane on the surface of the protective layer, obtained by binarization process of an optical microscopic observation, is less than 2.0%.

When the thickness of the protective layer comprising nickel or a nickel alloy is too thin, Cu, when laminating the intermediate layer and the superconducting compound layer thereon, may spread to the protective layer surface thereby possibly causing the surface to be oxidized, whereas when too thick, the crystal orientation of the protective layer is disordered and the plating strain also increases. For this reason, the thickness is suitably determined in consideration of these. Specifically, it is preferably 1 µm or more and 5 µm or less.

The plating process can be carried out by suitably employing conditions so that the plating strain in the protective layer is minimized. The plating strain herein refers to the degree of a strain caused within a plated film when applying the plating process to a base such as a metal plate. For example, when a layer comprising nickel is formed as the protective layer, it can be achieved by using a conventionally known plating bath such as Watts bath and sulfamate bath. Particularly, the sulfamate bath easily minimizes the plating strain of the protective layer, hence preferably used. Preferable ranges of the plating bath compositions are as follows, but not limited thereto.

(Watts Bath)
  Nickel sulfate 200 to 300 g/l
  Nickel chloride 30 to 60 g/l
  Boric acid 30 to 40 g/l
  pH 4 to 5
  Bath temperature 40 t 60° C.

(Sulfamate Bath)
  Nickel sulfamate 200 to 600 g/l
  Nickel chloride 0 to 15 g/l
  Boric acid 30 to 40 g/l
  Additive proper quantity
  pH 3.5 to 4.5
  Bath temperature 40 to 70° C.

The current density for carrying out the plating process is not limited and suitably determined in consideration of the balance with the time required for plating process. Specifically, for example, when a plating film of 2 µm or more is formed as the protective layer, a low current density prolongs the time required for plating process and consequently a line speed slows down to ensure such a time sometimes causing reduced productivity or making it difficult to control the plating. For this reason, it is typically preferable that the current density be 10 A/dm$^2$ or more. Further, the upper limit of the current density varies depending on the type of plating bath and is not particularly limited, but, for example, preferably 25 A/dm$^2$ or less for Watts bath and 35 A/dm$^2$ or less for sulfamate bath. Generally, when a current density exceeds 35 A/dm$^2$, good crystal orientation may not be obtained due to so-called burnt deposit. Further, the surface roughness of the plated protective layer tends to be higher than the surface roughness of the copper layer before plating, but polishing cannot be carried out after the protective layer is formed as the crystal orientation of the protective layer may be disordered. Accordingly, the surface roughness Ra(Ni) per unit area of 60×60 µm$^2$ is preferably 25 nm or less, more preferably 20 nm or less, by controlling the plating conditions.

The formed protective layer may generate micropits on the surface depending on the plating conditions. In such an instance, levelling off can be carried out as necessary by further heat treatment after plating to smooth the surface. The heat treatment temperature at this time is preferably, for example, 700 to 1000° C.

A superconducting wire can be produced by sequentially laminating the intermediate layer and the superconducting layer by the conventional method on the protective layer in the substrate for epitaxial growth described above. Specifically, the intermediate layer such as $CeO_2$, YSZ, $SrTiO_3$, MgO or $Y_2O_3$ is epitaxially film-formed using means such as sputtering on the protective layer formed by plating and a superconducting layer such as Y123-type is further film-formed thereon by the laser ablation method, thereby obtaining a superconducting wire. A protective layer comprising Ag and Cu may further be disposed as necessary on the superconducting layer.

EXAMPLE

Hereinafter, the present invention is further described in detail in reference to Examples and Comparative Examples but is not limited to these Examples.

Examples 1 to 4 and Comparative Examples 1 and 2

First, SUS316L (thickness 100 µm), used as the metal base material, and a copper foil (thickness as shown in Table 1) cold-rolled at a high rolling reduction ratio (a rolling reduction ratio of 96 to 99%) were subjected to sputter etching treatment in an Ar gas atmosphere at 0.05 to 1 Pa to carry out the surface-activated bonding and subsequently cold-bonded at a rolling reduction ratio of 0.1 to 1% to prepare a laminated material. The sputter etching treatment was carried out by disposing 2 100-W-output units in Examples and 2 160-W-output units in Comparative Examples. Each treatment time was 30 seconds in total.

The ratio of the (200) plane and the ratio of the (220) plane of the copper foil before and after laminated were determined by XRD measurement. The results are shown in Table 1.

Figure 5:
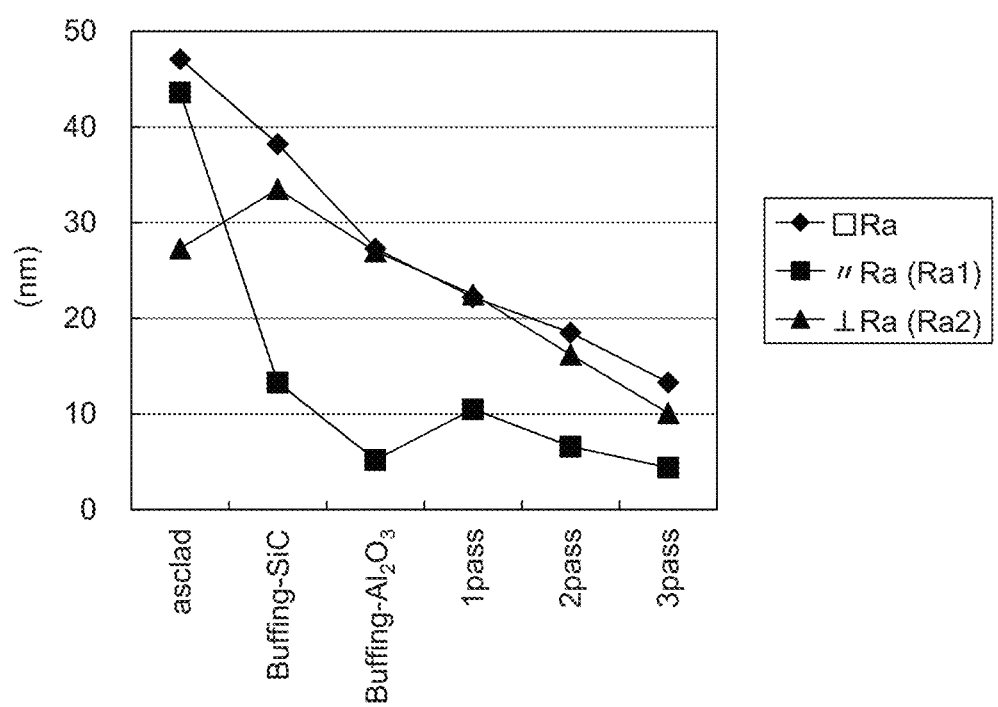
FIG. 5 is a graph showing changes in the surface roughness of the copper layer associated with the mechanical polishing.
Figure 6:
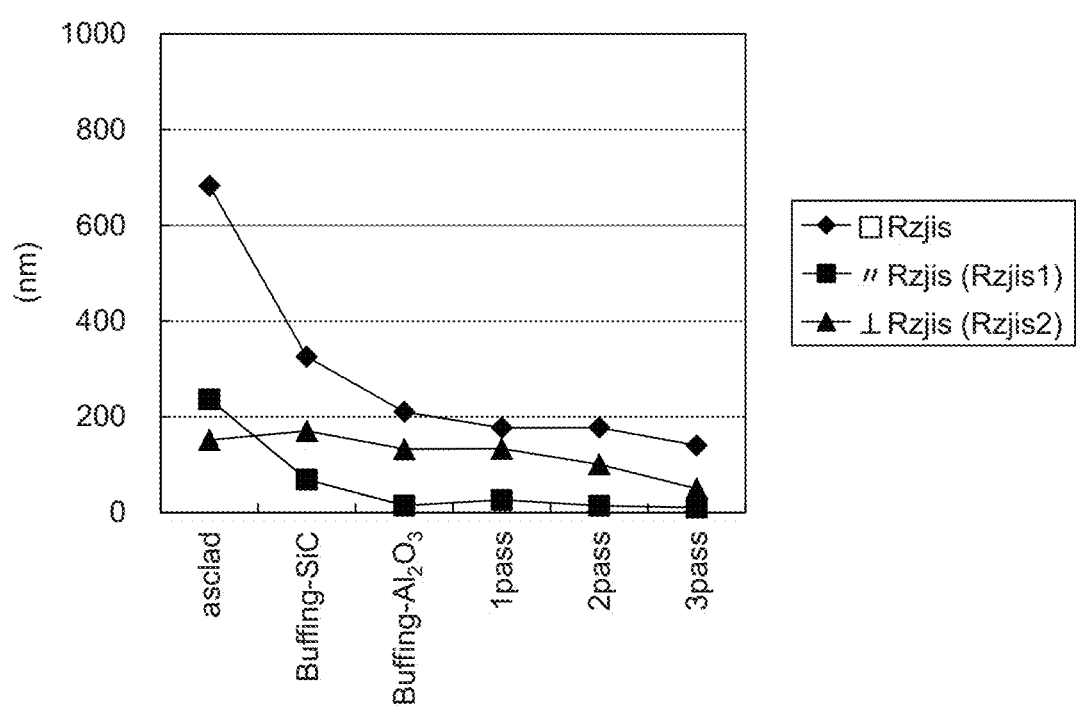
FIG. 6 is a graph showing changes in the surface roughness of the copper layer associated with the mechanical polishing.

Subsequently, the mechanical polishing of the bonded copper layer was carried out. Specifically, roll-buffing was carried out along the rolling direction using SiC grains and then roll-buffing was carried out using $Al_2O_3$ grains. Next, light rolling using a mirror surface roll at a rolling reduction ratio of 0 to 1% was repeated 3 times in total. The laminated material of Example 1 was measured after each step of the mechanical polishing for surface roughnesses Ra1, Ra2, Rzjis1 and Rzjis2 per unit length of 60 µm and Ra and Rzjis per unit area of 60×60 µm$^2$ using an AFM system (Nano ScopeIIIaD3000, manufactured by Digital Instruments). The results are shown in FIG. 5 and FIG. 6. In FIG. 5 and FIG. 6, "asclad" refers to the condition of the laminated material before the mechanical polishing was applied, and "1pass" to "3pass" refer to the first to the third light rolling using the mirror surface roll.

Next, the orientation heat treatment of the copper layer was carried out in each of the Examples and Comparative Examples. The heat treatment was applied, as the first step, at a temperature: 250 to 300° C., soaking time: 5 minutes, and subsequently as the second step, a temperature: 850 to 875° C., soaking time: 5 minutes. Note that both heat treatments were applied in a continuous heat treatment furnace.

After application of the orientation heat treatment, on the surface of the copper layer, the presence of the region occupied by crystal grains having crystal orientations other than the (200) plane (irregular part) present within 3 μm from the surface was confirmed and the area ratio was calculated by the binarization process of an optical microscopic observation image. The results are shown in Table 1. Note that the field size of the microscope image for confirming the irregular part was width 1.4 mm×length 1.06 mm=1.5 mm². Note that the c-axis orientation ratio of the copper layer after heat treatment was 99% or more in all Examples 1 to 4 and Comparative Examples 1 and 2.

TABLE 1

|  | Before laminated | | After laminated | | | After heat treatment | Copper foil thickness | |
| --- | --- | --- | --- | --- | --- | --- | --- | --- |
|  | $I0_{Cu}$ (%) | $I2_{Cu}$ (%) | $I0_{CLAD}$ (%) | $I2_{CLAD}$ (%) | $I0_{CLAD}$-$I0_{Cu}$ | Presence of irregular part | before laminated | Area of irregular part |
| Example 1 | 7.0 | 88.5 | 7.1 | 88.3 | 0.1 | Absent | 17 μm | |
| Example 2 | 7.0 | 88.5 | 11.4 | 83.1 | 4.4 | Absent | 17 μm | |
| Example 3 | 7.0 | 88.5 | 18.1 | 77.7 | 11.1 | Slightly present | 17 μm | Area ratio of less than 1.5% |
| Example 4 | 15.8 | 76.0 | 14.6 | 77.6 | −0.8 | Absent | 48 μm | |
| Comparative Example 1 | 7.0 | 88.5 | 39.7 | 57.2 | 32.7 | Present | 17 μm | Area ratio of 2% or more |
| Comparative Example 2 | 9 | 86.5 | 25.7 | 68.4 | 16.7 | Present | 17 μm | Area ratio of 1.7% |

As shown in Table 1, the appearance of the irregular part at the copper layer after the orientation heat treatment can be inhibited when the ratio of the (200) plane and the ratio of the (220) plane of the copper layer before and after laminated are controlled in such a way that $I0_{Cu}$<20%, $I2_{Cu}$=70 to 90%, and $I0_{CLAD}$<20%, $I2_{CLAD}$=70 to 90% and $I0_{CLAD}$-$I0_{Cu}$<13%. Additionally, as shown in FIG. 5 and FIG. 6, the combined use of buffing and light rolling using a mirror surface roll enables the effective reduction of the surface roughness at the copper layer.

Example 5 and Comparative Example 3

Figure 7:
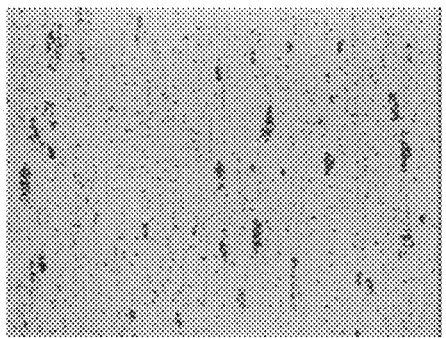
FIG. 7 is an optical microscope image of the protective layer surface at the substrate for epitaxial growth according to Example 5.
Figure 7:
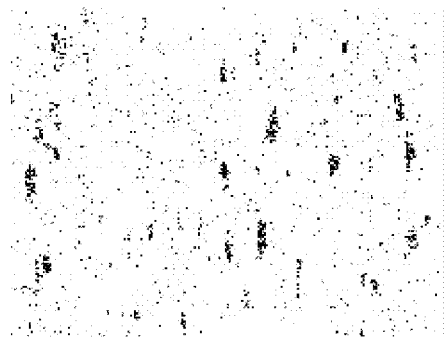
Figure 8:
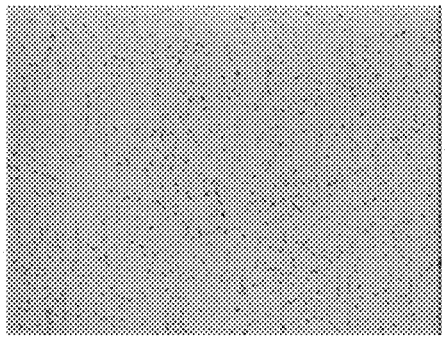
FIG. 8 is an optical microscope image of the protective layer surface at the substrate for epitaxial growth according to Comparative Example 3.
Figure 8:

Next, nickel plating was applied to each of the substrate for epitaxial growth which do not have the irregular part obtained in Example 1 and the substrate for epitaxial growth which have the irregular part obtained in Comparative Example 1 to form a protective layer. The products thus obtained are defined as Example 5 and Comparative Example 3, respectively. Then, as for the substrates for epitaxial growth of Example 5 and Comparative Example 3, the protective layer surfaces were observed using an optical microscope. The results are shown in FIG. 7 and FIG. 8. In each Figure, (a) represents the optical microscope image and (b) represents the binarized image thereof. The ratio occupied by crystal grains having crystal orientations other than the (200) plane at the protective layer surface calculated by the binarization process was 0.9% in Example 5 and 3% in Comparative Example 3, thereby suggesting that a high degree of crystal orientation was obtained in the substrate for epitaxial growth of the present invention. When the surface roughness at the protective layer surface was measured, the surface roughness Ra(Ni) per unit area of 60×60 μm² was 19.5 nm in Example 5 and the surface roughness Ra(Ni) was 23 nm in Comparative Example 3.

Reference Example

The impact of a rolling reduction ratio on the light rolling using a mirror surface roll was investigated.

First, SUS as the metal base material and a copper layer was activation-bonded to prepare an SUS/Cu laminated material. Subsequently, the copper layer surface was buffed and the surface roughnesses at the copper layer surface were reduced to Ra1=25 nm and Ra2=27 nm (measured using the same AFM system as Examples, values at 10 μm²). Next, the light rolling using a mirror surface roll was carried out at different rolling reduction ratios and the orientation heat treatment (250° C.×1 hr) was applied, followed by measuring a crystal orientation degree Δϕ of the copper layer. The rolling reduction ratio was calculated from the entire plate thickness before and after the light rolling. The results are shown in Table 2.

TABLE 2

| Plate thickness of laminated material (mm) | Rolling reduction ratio (%) | Crystal orientation degree Δϕ |
| --- | --- | --- |
| 0.116 | — (Light rolling not applied) | 4.72 |
| 0.116 | 0 | 4.56 |
| 0.113 | 2.6 | 5.72 |

The surface roughnesses can be reduced to Ra1=15 and Ra2=16 at a rolling reduction ratio of 2.6% but, as shown in Table 2, the crystal orientation degree slightly deteriorates. When a rolling reduction ratio exceeds 2%, a strain due to the rolling is introduced into the copper layer, presumably adversely affecting at the time of the crystal orientation. Accordingly, the rolling reduction ratio is preferably 2% or less, more preferably 1.5% or less, particularly preferably 1% or less. Note that, in Table 2, the laminated material having a rolling reduction ratio of 0% did not mean that it was not reduced because a pre-set rolling reduction at a rolling mill was −0.15 μm, however, no difference was observed in the μm order at the laminated material before and after rolled, resulting in the calculated value based on the plate thickness of 0%.

REFERENCE SINGS LIST

1 Metal base material
2 Copper layer
3 Sputter etching system
4 Cooling roll
5 Rolling roll
10 Metal base material
20 Copper layer
21 Copper layer orienting to the (200) plane
30 Flap wheel a1 Recrystallized region
a2 Work strain
a3 Irregular part All publications, patents, and patent applications cited in this Description are herein incorporated by reference in their entirety.

We claim:

1. A method for producing a substrate for epitaxial growth, the method comprising:

laminating a metal base material and a copper layer having an fcc rolling texture by surface-activated bonding, each of the metal base material and the copper layer including a bonding surface and an opposing surface on an opposing side of the respective metal base material and the copper layer from the bonding surface, applying mechanical polishing to the opposing surface of the copper layer, and carrying out orientation heat treatment of the copper layer, wherein an etching time and output during the surface-activated bonding are adjusted in such a way that, when ratios of a (200) plane of the copper layer before laminated and of the copper layer after laminated when measured by XRD are $I0_{Cu}$ and $I0_{CLAD}$, respectively and ratios of a (220) plane of the copper layer before laminated and of the copper layer after laminated are $I2_{Cu}$ and $I2_{CLAD}$, respectively, $I0_{Cu}<20\%$, $I2_{Cu}=70$ to $90\%$, and $I0_{CLAD}<20\%$, $I2_{CLAD}=70$ to $90\%$ and $I0_{CLAD}-I0_{Cu}<13\%$;

wherein, on the opposing surface of the copper layer after carrying out the orientation heat treatment, an area occupied by crystal grains having crystal orientations other than the (200) plane present within 3 μm from the opposing surface is less than 1.5%; and wherein a depth of cut in a thickness direction by the mechanical polishing is 2 μm to 5 μm.

2. The method according to claim 1, wherein the applying mechanical polishing includes buffing.

3. The method according to claim 1, wherein the laminating by surface-activated bonding is carried out by bonding the metal base material and the copper layer using a rolling roll, and the applying mechanical polishing is carried out by applying polishing by roll-buffing in the same direction as the rolling direction and subsequently applying light-rolling at a rolling reduction ratio of 0 to 1% using a mirror surface roll wherein, at the copper layer after applying mechanical polishing, a surface roughness along the same direction as the rolling direction per unit length of 60 μm when measured by AFM is Ra1<10 nm and a surface roughness along the perpendicular direction to the rolling direction is Ra2<30 nm.

* * * * *